(12) United States Patent
Chang et al.

(10) Patent No.: US 9,589,971 B1
(45) Date of Patent: Mar. 7, 2017

(54) ANTI-FUSE ONE-TIME PROGRAMMABLE MEMORY CELL AND ANTI-FUSE ONE-TIME PROGRAMMABLE MEMORY ARRAY

(71) Applicant: Vanguard International Semiconductor Corporation, Hsinchu (TW)

(72) Inventors: Chia-Chiuan Chang, Jhunan Township (TW); Jui-Lung Chen, Hsinchu (TW); Yu-Wen Chen, Jhubei (TW); Hsuan-Chi Su, Taoyuan (TW); Ching-Hsiang Lin, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/262,376

(22) Filed: Sep. 12, 2016

(51) Int. Cl.
| | |
|---|---|
| *G11C 17/16* | (2006.01) |
| *H01L 27/112* | (2006.01) |
| *H01L 29/78* | (2006.01) |
| *H01L 23/525* | (2006.01) |
| *H01L 29/10* | (2006.01) |
| *G11C 17/18* | (2006.01) |
| *G11C 17/12* | (2006.01) |
| *H01L 23/522* | (2006.01) |

(52) U.S. Cl.
CPC ........ *H01L 27/11206* (2013.01); *G11C 17/16* (2013.01); *G11C 17/18* (2013.01); *H01L 23/5252* (2013.01); *H01L 27/11293* (2013.01); *H01L 29/1083* (2013.01); *H01L 29/7833* (2013.01); *G11C 17/12* (2013.01); *G11C 17/165* (2013.01); *G11C 2213/79* (2013.01); *H01L 23/5228* (2013.01); *H01L 29/1033* (2013.01)

(58) Field of Classification Search
CPC ..... G11C 17/16; G11C 17/12; G11C 2213/79; H01L 27/11206; H01L 23/5252; H01L 23/5228; H01L 29/7833; H01L 29/1033
USPC ...................... 365/96, 72; 257/529, 336, 530
See application file for complete search history.

(56) References Cited

U.S. PATENT DOCUMENTS

| | | | |
|---|---|---|---|
| 2008/0074915 A1* | 3/2008 | Terzioglu ............... | G11C 17/16 365/96 |
| 2014/0098591 A1* | 4/2014 | Chen ...................... | G11C 17/18 365/96 |

(Continued)

*Primary Examiner* — Ly D Pham
(74) *Attorney, Agent, or Firm* — Birch, Stewart, Kolasch & Birch, LLP

(57) ABSTRACT

An anti-fuse memory cell is provided. The anti-fuse memory cell includes a programmable transistor and a selection transistor. The programmable transistor includes a gate structure, a first doped region and a lightly doped region. The first doped region is divided into a first portion doped region, a second portion doped region and a third portion doped region. The first and second portion doped regions are respectively a source and a drain of the programmable transistor, and the third portion doped region is disposed between the first and second portion doped regions. The lightly doped region is distributed around a channel region of the programmable transistor, and adjacent to the first, second and third portion doped regions. The selection transistor includes a gate structure and a second doped region, and connected in series to the programmable transistor through the first portion doped region.

16 Claims, 15 Drawing Sheets

(56) References Cited

U.S. PATENT DOCUMENTS

2015/0171094 A1* 6/2015 Hofmann .............. G11C 17/16
                                                    257/379
2015/0287730 A1* 10/2015 Wu ...................... G11C 5/06
                                                    365/96

* cited by examiner

ANTI-FUSE ONE-TIME PROGRAMMABLE MEMORY CELL AND ANTI-FUSE ONE-TIME PROGRAMMABLE MEMORY ARRAY

TECHNICAL FIELD

The disclosure relates to an anti-fuse one-time programmable memory cell, and more particularly to the anti-fuse one-time programmable memory cell with improvements of reading characteristic and leakage current.

BACKGROUND

One-time programmable memory is one type of non-volatile memory. FIG. 1A shows a cross-sectional view of an anti-fuse one-time programmable memory cell 10. In FIG. 1A, the anti-fuse one-time programmable memory cell 10 comprises a P well region 101, a gate structure 102, a gate structure 103, a first N-type doped region 104, a second N-type doped region 105, a third N-type doped region 106 and N-type lightly doped drains (NLDD) 107-110, wherein the gate structure 102, the first N-type doped region 104, the second N-type doped region 105 and the N-type lightly doped drains 107-108 constitute a selection transistor 11, and the gate structure 103, the second N-type doped region 105, the third N-type doped region 106 and N-type lightly doped drains 109-110 constitute a programmable transistor 12. The first N-type doped region 104 of the selection transistor 11 is electrically connected to a bit line BL, and the gate structure 102 of the selection transistor is electrically connected to a word line WL.

FIG. 1B illustrates that permanent conductive paths 18 and 19 could be formed in the programmable transistor 12 of the anti-fuse one-time programmable memory cell 10 during the programming operation. In FIG. 1B, during a programming operation, the voltage of the bit line BL is 0, a voltage which is higher than a threshold voltage of the selection transistor is provided to the word line WL, and a high voltage (programming voltage) is provided to the gate structure 103 of the programmable transistor 12. At this time, the selection transistor 11 is on, and the programming voltage provided to the gate structure 103 induces a voltage between the gate structure 103 and the second N-type doped region 105 of the programmable transistor 12. The induced voltage results in breakdown occurring in the gate oxide layer (or gate dielectric layer) of the gate structure 103 of the programmable transistor 12 causing the gate oxide layer to rupture. When the rupturing of the gate oxide layer occurs between the gate structure 103 and the P well region 101, a permanent conductive path 18 is formed between the P well region 101 and the gate structure 103. When the rupturing of the gate oxide layer occurs between the gate structure 103 and the N-type lightly doped drain 109, a permanent conductive path 19 is formed between the second N-type doped region 105 and the gate structure 103.

FIGS. 1C-1E show equivalent circuit diagrams of the anti-fuse one-time programmable memory cell 10 before and after programming. In FIG. 1C, the anti-fuse one-time programmable memory cell 10 has not performed a programming operation. At this time, the anti-fuse one-time programmable memory cell 1 includes a selection transistor 11 and a programmable transistor 12. In FIG. 1D, the anti-fuse one-time programmable memory cell 10 accomplishes the programming operation and the permanent conductive path 18 is formed correspondingly. At this time, the programmable transistor 12 is equivalent to a resistor R1 constituted by the permanent conductive path 18. In FIG. 1E, the anti-fuse one-time programmable memory cell 10 accomplishes the programming operation and the permanent conductive path 19 is formed accordingly. At this time, the programmable transistor 12 is equivalent to a resistor R2 constituted by the permanent conductive path 19.

Back to FIG. 1B, the permanent conductive paths 18 and 19 have different resistances. For the anti-fuse one-time programmable memory cell 10, an equivalent resistance of the permanent conductive path 18 is lower than the equivalent resistance of the permanent conductive path 19 in a read operation so that conduction current flowing through the permanent conductive path 18 is greater than conduction current flowing through the permanent conductive path 19 with an identical read voltage. Accordingly, if a permanent conductive path 18 is formed in the programming operation, a sense amplifier from outside the anti-fuse one-time programmable memory cell 10 can read larger conduction currents. On the other hand, if only the permanent conductive path 19 is formed in the programming operation, then lower conduction current flowing through the permanent conductive path 19 could result in misjudgment by the sense amplifier. In addition, rupture positions of the gate oxide layer (or gate dielectric layer) are randomly distributed and cannot be controlled by the programming voltage provided to the gate structure 103 of the programmable transistor 12.

Accordingly, how to let a breakdown occurring on the N-type lightly doped drain 109 form the permanent conductive path 18 (or to avoid only forming the permanent conductive path 19) becomes an important issue.

SUMMARY

In view of this, an anti-fuse one-time programmable memory cell of the present disclosure is provided to improve misjudgments in the read operation. In addition, another anti-fuse one-time programmable memory cell of the present disclosure is provided to improve misjudgments in the read operation and is also provided to reduce leakage current.

An embodiment of the present disclosure provides an anti-fuse one-time programmable memory cell. The anti-fuse one-time programmable memory cell comprises a substrate, a well region, a first programmable transistor and a selection transistor. The well region is disposed on the substrate. The first programmable transistor comprises a gate structure, a first doped region and a first lightly doped region. The gate structure is disposed on the well region. The first doped region is divided into a first portion doped region, a second portion doped region and a third portion doped region. The first, second and third portion doped regions are respectively disposed at three sides of the gate structure of the first programmable transistor and disposed in the well region. The first and second portion doped regions are respectively a source and a drain of the first programmable transistor, and the third portion doped region is disposed between the first and second portion doped regions. The first lightly doped region is disposed in the well region, wherein the first lightly doped region is distributed around a channel region of the first programmable transistor and the first lightly doped region is respectively adjacent to the first, second and third portion doped regions. The selection transistor is connected in series to the first programmable transistor through the first portion doped region and comprises a gate structure and a second doped region. The gate structure of the selection transistor is electrically connected to a word line. The first and second portion doped regions are respectively disposed on both sides of the gate structure of the selection transistor and the second doped region is electrically connected to a bit line.

An embodiment of the present disclosure provides an anti-fuse one-time programmable memory array. The anti-fuse one-time programmable memory array comprises a first memory cell, a first word line, a first bit line, a first anti-fuse gate line, a second memory cell, a second word line, a second bit line, a second anti-fuse gate line and an isolation gate structure. The structure of the first memory cell is the same as the anti-fuse one-time programmable memory cell of the above embodiment. The first word line is electrically connected to the gate structure of the selection transistor of the first memory cell. The first bit line is electrically connected to the second doped region of the selection transistor of the first memory cell. The first anti-fuse gate line is electrically connected to the gate structure of the first programmable transistor of the first memory cell. The structure of the second memory cell is the same as the anti-fuse one-time programmable memory cell of claim 1. The first and second memory cells share the same substrate and the same well region. The second word line is electrically connected to the gate structure of the selection transistor of the second memory cell. The second bit line is electrically connected to the second doped region of the selection transistor of the second memory cell. The second anti-fuse gate line is electrically connected to the gate structure of the first programmable transistor of the second memory cell. The isolation gate structure is disposed between the second portion doped region of the first memory cell and the second portion doped region of the second memory cell.

In another embodiment of the present disclosure, the anti-fuse one-time programmable memory cell further comprises an insulated transistor, wherein the second portion doped region is shared by the insulated transistor and the first programmable transistor; and wherein the insulated transistor comprises a gate structure disposed on the well region and the gate structure of the insulated transistor is electrically connected to the substrate.

In another embodiment of the present disclosure, the insulated transistor of the anti-fuse one-time programmable memory cell further comprises a third doped region disposed in the well region, wherein the second portion doped region and the third doped region are respectively disposed at both sides of the gate structure of the insulated transistor.

In another embodiment of the present disclosure, the anti-fuse one-time programmable memory cell further comprises a second programmable transistor which shares the second portion doped region with the first programmable transistor, wherein the second programmable transistor comprises a gate structure and a second lightly doped region. The gate structure is disposed on the well region and electrically connected to the gate structure of the first programmable transistor. The second lightly doped region is disposed between the second portion doped region and a second selection gate.

BRIEF DESCRIPTION OF THE DRAWINGS

The present disclosure can be more fully understood by reading the subsequent detailed description and examples with references made to the accompanying drawings, wherein.

DETAILED DESCRIPTION

The following description is of the best-contemplated mode of carrying out the present disclosure. This description is made for the purpose of illustrating the general principles of the present disclosure and should not be taken in a limiting sense. The scope of the present disclosure is best determined by reference to the appended claims.

Figure 2A:
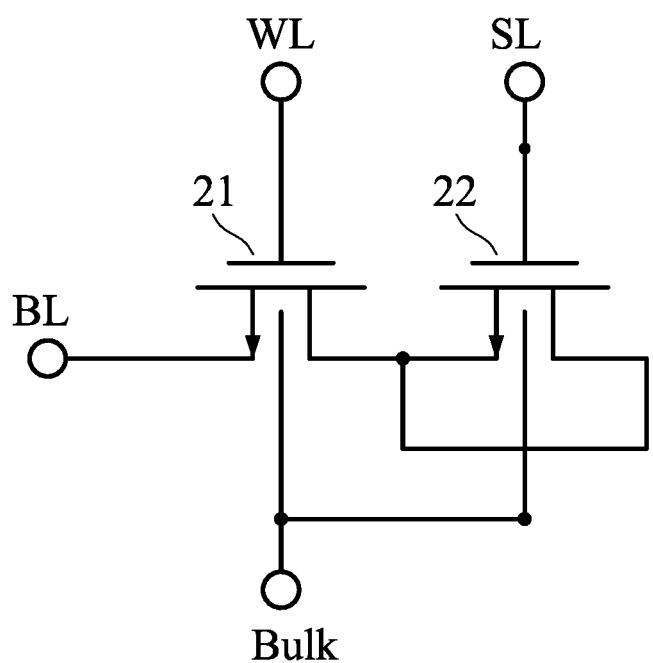
FIG. 2A shows a circuit diagram of an anti-fuse one-time programmable memory cell 20 according to an embodiment of the present disclosure.

FIG. 2A shows a circuit diagram of an anti-fuse one-time programmable memory cell 20 according to an embodiment of the present disclosure. In FIG. 2A, the anti-fuse one-time programmable memory cell 20 comprises a selection transistor 21 and a programmable transistor 22. A word line WL is electrically connected to a gate of the selection transistor 21. A terminal (source or drain) of the selection transistor 21 is electrically connected to a bit line BL, another terminal (drain or source) of the selection transistor 21 is electrically connected to the programmable transistor 22. A gate of the programmable transistor 22 is electrically connected to an anti-fuse gate line SL, and two terminals of the programmable transistor 22 are electrically connected together.

Figure 2B:
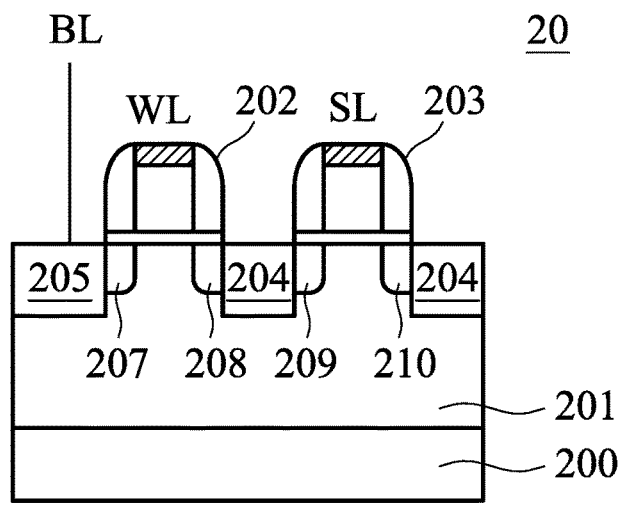
FIG. 2B shows a cross-sectional view of the anti-fuse one-time programmable memory cell 20 according to an embodiment of the present disclosure.

FIG. 2B shows a cross-sectional view of the anti-fuse one-time programmable memory cell 20 according to an embodiment of the present disclosure. In the embodiment of FIG. 2B of the present disclosure, a P well region 201 is disposed on a substrate 200. The selection transistor 21 and the programmable transistor 22 are disposed in the P well region 201. The selection transistor 21 comprises a gate structure 202, a first N-type doped region 204, a second N-type doped region 205 and N-type lightly doped drains 207-208.

In FIG. 2B, the programmable transistor 22 comprises a gate structure 203, the first N-type doped region 204 and N-type lightly doped drains 209-211. Accordingly, one terminal (drain or source) of the selection transistor 21 is the first N-type doped region 204, and another one terminal (drain or source) of the selection transistor 21 is the second N-type doped region 205. Two terminals of the programmable transistor 22 are both the first N-type doped region 204.

In the embodiment of the present disclosure, if the anti-fuse one-time programmable memory cell 20 is undergoing a programming operation and the anti-fuse one-time programmable memory cell 20 is selected to be written in digital information, a high voltage is provided to the word line WL, the voltage of the bit line BL is set to 0, the programming voltage of the anti-fuse gate line SL is provided to the gate structure 203 of the programmable transistor 22 to burn out the gate dielectric layer of the gate structure 203 so that the programming voltage is provided to the first N-type doped region 204 through the gate dielectric layer.

In the embodiment of the present disclosure, when the anti-fuse one-time programmable memory cell 20 is undergoing a read operation, the bit line BL is connected to the sense amplifier, and the anti-fuse gate line SL provides a high voltage (read voltage) on the gate structure 203 of the programmable transistor 22. At this time, conduction current induced by the high voltage (read voltage) flows through the gate dielectric layer which has burned out, the first N-type doped region 204, the second N-type doped region 205 and the bit line BL to the sense amplifier. Therefore the sense amplifier reads storage information of the anti-fuse one-time programmable memory cell 20 according to whether the conduction current is sensed or not (determining whether the anti-fuse one-time programmable memory cell 20 has been programmed or not).

Figure 2C:
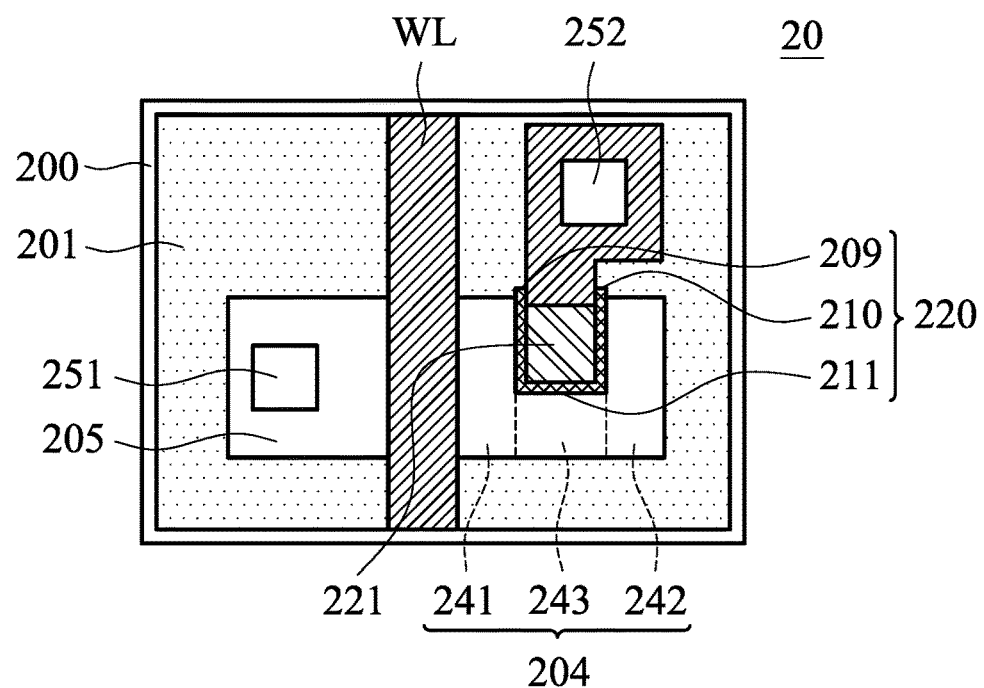
FIG. 2C shows a top view of an integrated circuit layout of the anti-fuse one-time programmable memory cell 20 of FIG. 2B according to an embodiment of the present disclosure.

FIG. 2C shows a top view of an integrated circuit layout of the anti-fuse one-time programmable memory cell 20 of FIG. 2B according to an embodiment of the present disclosure. In FIG. 2C, a metal contact 251 having ohmic contact is formed on the second N-type doped region 205. The metal contact 251 is used to be electrically connected between the second N-type doped region 205 and the bit line BL. The word line WL is electrically connected to the gate structure 202 of the selection transistor 21. In FIG. 2C, the word line WL is implemented by a silicon layer or a metal layer, the present disclosure is not limited thereto. The word line WL also can be implemented by conduct lines of other materials. A metal contact 252 having ohmic contact is formed on the programmable transistor 22. The metal contact 252 is used to be electrically connected between a gate of the programmable transistor 22 and the anti-fuse gate line SL.

In FIG. 2C, the first N-type doped region 204 is divided into a first portion doped region 241, a second portion doped region 242 and a third portion doped region 243. The programmable transistor 22 is connected in series to the selection transistor 21 through the first portion doped region 241. The first portion doped region 241 and the second portion doped region 242 are respectively a drain and a source of the programmable transistor 22. In FIG. 2C, the gate structure 203 of the programmable transistor 22 is disposed to vacate an area for disposing the third portion doped region 243 and the N-type lightly doped drain 211. Accordingly, the third portion doped region 243 is disposed between the first portion doped region 241 and the second portion doped region 242.

In FIG. 2C, the first portion doped region 241, the second portion doped region 242 and the third portion doped region 243 are respectively disposed at three sides of the gate structure 203 of the programmable transistor 22 and disposed in the P well region 201. More specifically, the N-type lightly doped drain 209 is disposed between the gate structure 203 and the first portion doped region 241, the N-type lightly doped drain 210 is disposed between the gate structure 203 and the second portion doped region 242, and the N-type lightly doped drain 211 is disposed between the gate structure 203 and the third portion doped region 243. The adjacent N-type lightly doped drains 209-211 constitute a first lightly doped region 220. Hence the first lightly doped region 220 is adjacent to the first portion doped region 241, the second portion doped region 242 and the third portion doped region 243, and the first lightly doped region 220 is disposed around a channel region 221 of the programmable transistor 22.

Figure 1A:
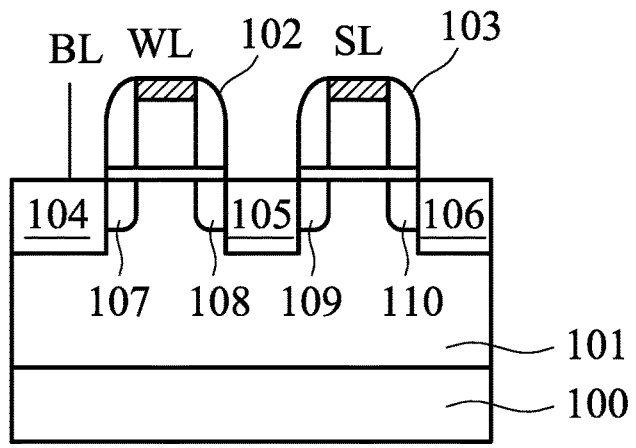
FIG. 1A shows a cross-sectional view of an anti-fuse one-time programmable memory cell 10.
Figure 1B:
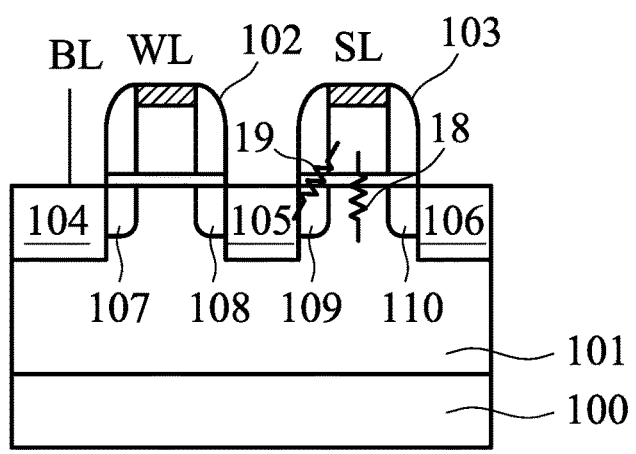
FIG. 1B shows a top view of an integrated circuit layout of the anti-fuse one-time programmable memory cell 10.
Figure 1C:
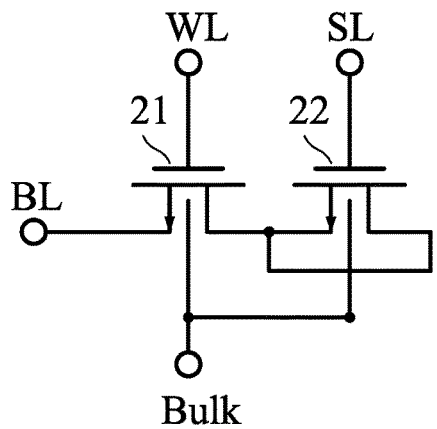
FIG. 1C show an equivalent circuit diagram of the anti-fuse one-time programmable memory cell 10 before programming.
Figure 1D:
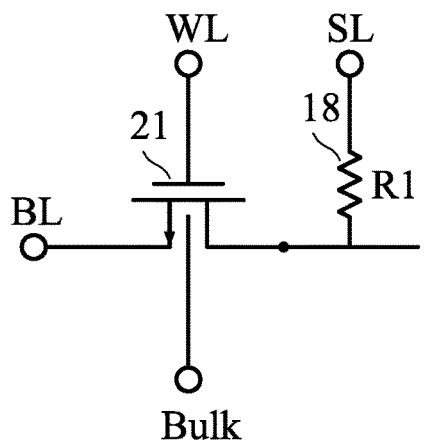
FIGS. 1D-1E show equivalent circuit diagrams of the anti-fuse one-time programmable memory cell 10 after programming.
Figure 1E:
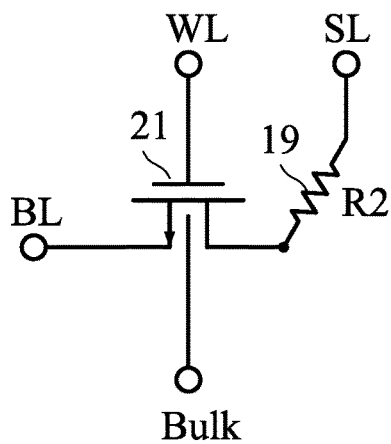

Compared to the programmable transistor 12 of FIG. 1B, the positions of the N-type lightly doped drain 211 and the second portion doped region 242 of the programmable transistor 22 of FIG. 2C can correspond to the channel region of the programmable transistor 12 of FIG. 1B. Accordingly, the area of the N-type lightly doped drains 209-211 of the programmable transistor 22 of FIG. 2C is larger than the area of the N-type lightly doped drains 109 of the programmable transistor 12, and the channel region 221 of the programmable transistor 22 is smaller than the channel region of the programmable transistor 12. Accordingly, the ratio of the areas of the first lightly doped region 220 and the channel region 221 in FIG. 2C is higher than the ratio of the areas of the N-type lightly doped drains 109 and the channel region in FIG. 1B.

Compared to the gate structure 103 of the programmable transistor 12 of FIG. 1B, the above difference in area ratios is a result of breakdowns occurring at the first lightly doped region 220 more often than at the N-type lightly doped drains 109. Accordingly, there is higher probability of forming a permanent conductive path with lower resistance in the programmable transistor 12. Compared to the anti-fuse one-time programmable memory cell 10, when the anti-fuse one-time programmable memory cell 20 is undergoing a read operation, the sensed amplifier connected to the bit line BL can read larger conduction currents.

Figure 3A:
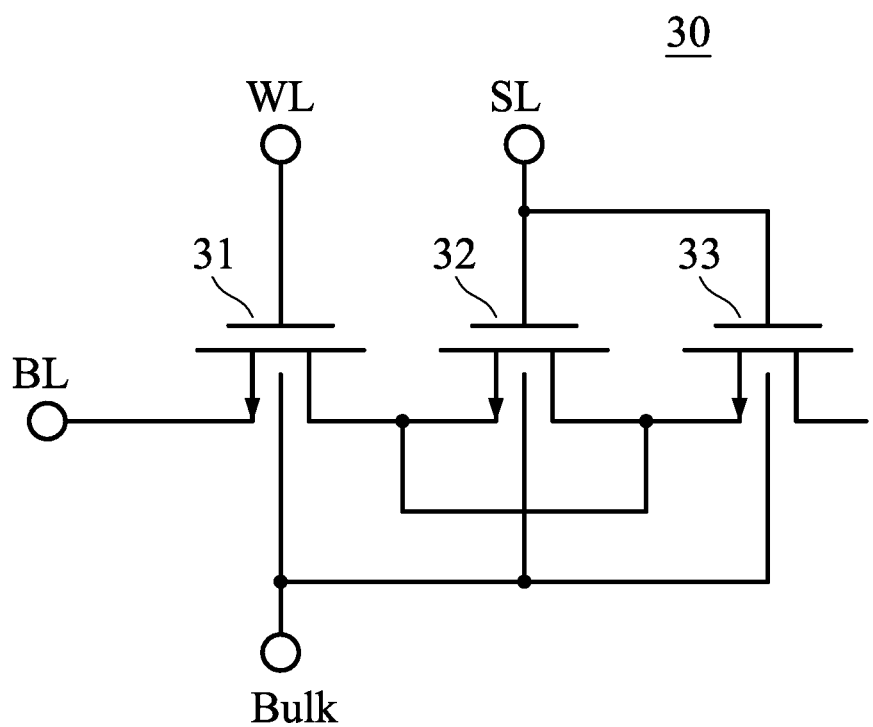
FIG. 3A shows a circuit diagram of an anti-fuse one-time programmable memory cell 30 according to an embodiment of the present disclosure.

FIG. 3A shows a circuit diagram of an anti-fuse one-time programmable memory cell 30 according to an embodiment of the present disclosure. In FIG. 3A, the anti-fuse one-time programmable memory cell 30 comprises a selection transistor 31 and a programmable transistor 32. A word line WL is electrically connected to a gate of the selection transistor 31. A terminal (source or drain) of the selection transistor 31 is electrically connected to a bit line BL, another terminal (drain or source) of the selection transistor 31 is electrically connected to the programmable transistor 32. A gate of the programmable transistor 32 is electrically connected to an anti-fuse gate line SL, and two terminals of the programmable transistor 32 are electrically connected together. Compared to the anti-fuse one-time programmable memory cell 20 of FIG. 2A, the anti-fuse one-time programmable memory cell 30 of FIG. 3A further comprises a programmable transistor 33. In the embodiment of the present disclosure, the programmable transistor 33 can provide additional permanent conductive paths so that the sensed amplifier connected to the bit line BL can read larger conduction currents. In this way, the sensed amplifier can read the anti-fuse one-time programmable memory cell 30 more accurately.

Figure 3B:
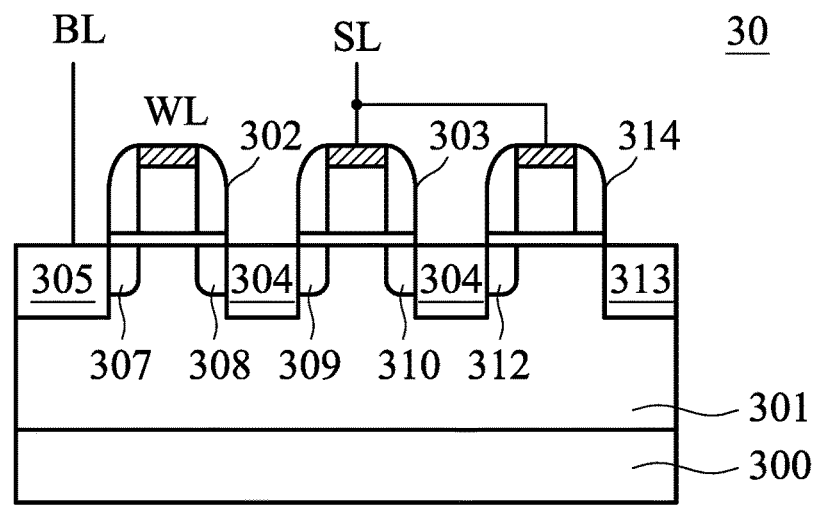
FIG. 3B shows a cross-sectional view of the anti-fuse one-time programmable memory cell 30 according to an embodiment of the present disclosure.

FIG. 3B shows a cross-sectional view of the anti-fuse one-time programmable memory cell 30 according to an embodiment of the present disclosure. In the embodiment of FIG. 3B of the present disclosure, a P well region 301 is disposed on a substrate 300. The selection transistor 31, the programmable transistor 32 and the programmable transistor 33 are disposed in the P well region 301. The selection transistor 31 comprises a gate structure 302, a first N-type doped region 304, a second N-type doped region 305 and N-type lightly doped drains 307-308. The programmable transistor 32 comprises a gate structure 303, the first N-type doped region 304 and N-type lightly doped drains 309-311. The programmable transistor 33 comprises a gate structure 314, the first N-type doped region 304, a fourth N-type doped region 313 and an N-type lightly doped drain 312. Compared to the anti-fuse one-time programmable memory cell 20 of FIG. 2B, the anti-fuse one-time programmable memory cell 30 of FIG. 3B further comprises the gate structure 314, the fourth N-type doped region 313 and the N-type lightly doped drain 312.

In the embodiment of FIG. 3B of the present disclosure, if the anti-fuse one-time programmable memory cell 30 is undergoing a programming operation and the anti-fuse one-time programmable memory cell 30 is selected to be written in digital information, a high voltage is provided to the word line WL, the voltage of the bit line BL is set to 0, the programming voltage of the anti-fuse gate line SL is provided to the gate structure 303 of the programmable transistor 32 and the gate structure 314 of the programmable transistor 33 to burn out the gate dielectric layers of the gate structures 303 and 314 so that the programming voltage is provided to the first N-type doped region 304 through the gate dielectric layer.

In the embodiment of FIG. 3B of the present disclosure, when the anti-fuse one-time programmable memory cell 30 is undergoing a read operation, the bit line BL is connected to the sense amplifier, and the anti-fuse gate line SL provides a high voltage (read voltage) on the gate structures 303 and 314. At this time, conduction current induced by the high voltage (read voltage) flows through the gate dielectric layers which have burned out (the gate dielectric layers of the gate structures 303 and 314), the first N-type doped region 304, the second N-type doped region 305 and the bit line BL to the sense amplifier. Therefore the sense amplifier reads storage information of the anti-fuse one-time programmable memory cell 30 according to whether the conduction current is sensed or not (determining whether the anti-fuse one-time programmable memory cell 30 has been programmed or not).

Figure 3C:
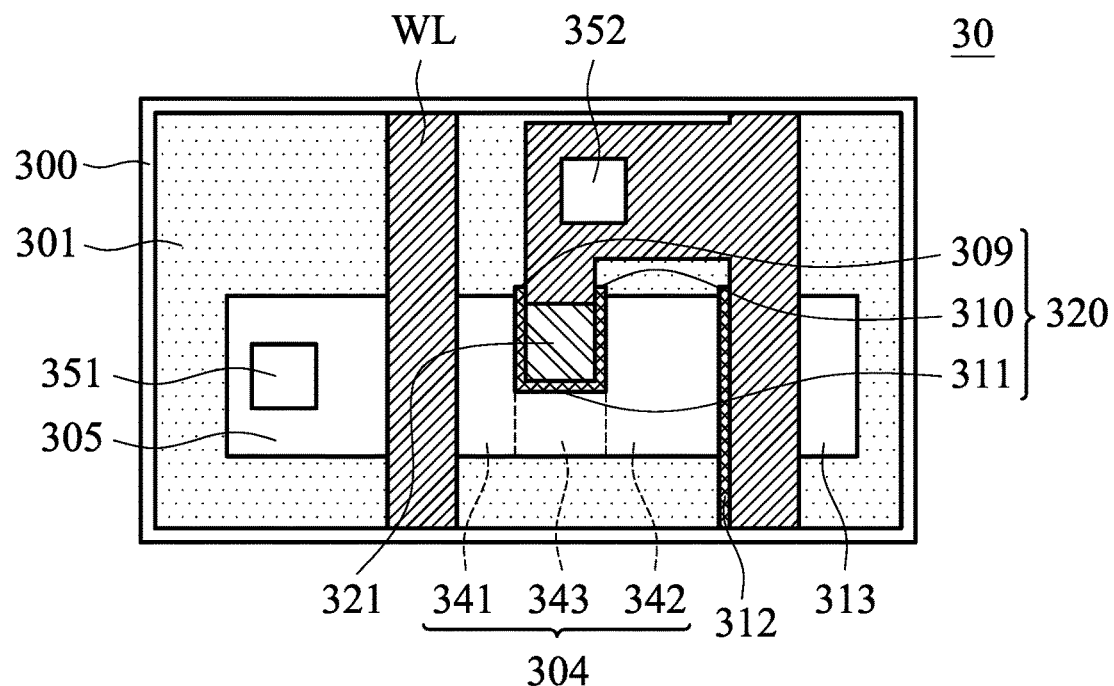
FIG. 3C shows a top view of an integrated circuit layout of the anti-fuse one-time programmable memory cell 30 of FIG. 3B according to an embodiment of the present disclosure.

FIG. 3C shows a top view of an integrated circuit layout of the anti-fuse one-time programmable memory cell 30 of FIG. 3B according to an embodiment of the present disclosure. Compared to FIG. 2C, the anti-fuse one-time programmable memory cell 30 of FIG. 3C further comprises the fourth N-type doped region 313 and the N-type lightly doped drain 312. In addition, a polysilicon layer (or a metal layer) covering the gate structure 303 extends to cover on the gate structure 314 so that the gate structure 303 is electrically connected to the gate structure 314. In FIG. 3C, the N-type lightly doped drain 312 is disposed between a second portion doped region 342 of the first N-type doped region 304 and the gate structure 314.

As in FIG. 2C, the anti-fuse one-time programmable memory cell 30 of FIG. 3C also comprises a first lightly doped region 320, wherein the first lightly doped region 320 comprises N-type lightly doped drains 309, 310 and 311. In addition, the first N-type doped region 304 also comprises a first portion doped region 341, a second portion doped region 342 and a third portion doped region 343. In FIG. 3C, the gate structure 303 of the programmable transistor 32 is disposed to vacate an area for disposing the third portion doped region 343 and the N-type lightly doped drain 311. Accordingly, the third portion doped region 343 is disposed between the first portion doped region 341 and the second portion doped region 342. The first lightly doped region 320 is respectively adjacent to the first portion doped region 341, the second portion doped region 342 and the third portion doped region 343, and the first lightly doped region 320 is disposed around a channel region 321 of the programmable transistor 32. A metal contact 351 having ohmic contact is formed on the second N-type doped region 305. The metal contact 351 is used to be electrically connected between the second N-type doped region 305 and the bit line BL. The word line WL is electrically connected to the gate structure 302 of the selection transistor 31. A metal contact 352 having ohmic contact is formed on the programmable transistor 32. The metal contact 352 is used to be electrically connected between a gate of the programmable transistor 32 and the anti-fuse gate line SL.

Unlike FIG. 2C, the anti-fuse one-time programmable memory cell 30 of the present disclosure further comprises a second lightly doped region. In FIG. 3C, the second lightly doped region is the N-type lightly doped drain 312. In the embodiment of the present disclosure, the purpose of disposing the N-type lightly doped drain 312 is to provide a new permanent conductive path. Accordingly, when the anti-fuse one-time programmable memory cell 30 is operated in the read operation, the sensed amplifier connected to the bit line BL can read larger conduction currents.

In FIG. 3C, if the anti-fuse one-time programmable memory cell 30 is undergoing a programming operation and the anti-fuse one-time programmable memory cell 30 is selected to be written in digital information, the programming voltage of the anti-fuse gate line SL is provided to a gate dielectric layer of the gate structure 314 of the programmable transistor 33 so that programming voltage is provided between the gate dielectric layer of the gate structure 314 and the third portion doped region 343 of the first N-type doped region 304.

At this time, breakdown occurs in the N-type lightly doped drain 312 and the gate oxide layer (or gate dielectric layer) of the gate structure 314 and a permanent conductive path is formed correspondingly. Compared to the permanent conductive path formed in the channel region 321 of the programmable transistor 32, the new permanent conductive path formed in the N-type lightly doped drain 312 of the programmable transistor 33 has a lower resistance. In addition, the permanent conductive path formed in the programmable transistor 32 is parallel connected to the new permanent conductive path formed in the programmable transistor 33. Accordingly, when the anti-fuse one-time programmable memory cell 30 is operated in the read operation, the sensed amplifier connected to the bit line BL can read larger conduction currents.

Figure 3D:
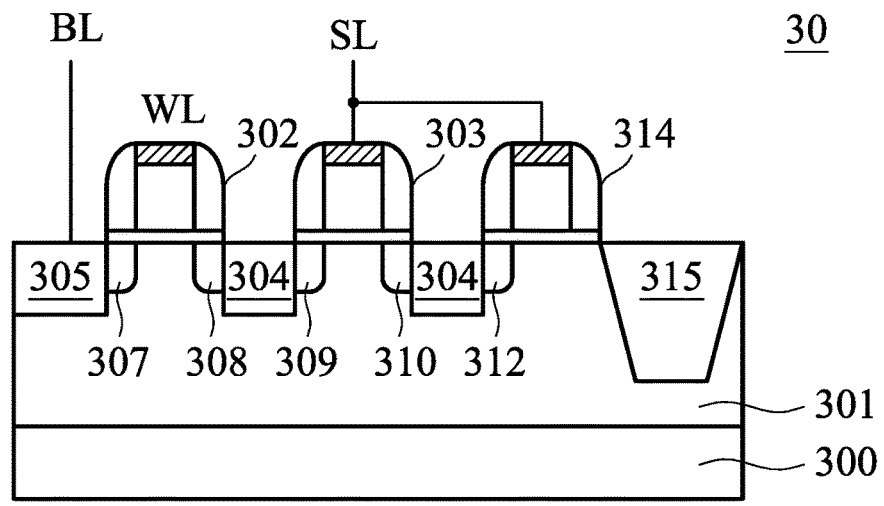
FIG. 3D shows a cross-sectional view of the anti-fuse one-time programmable memory cell 30 according to another embodiment of the present disclosure.

FIG. 3D shows a cross-sectional view of the anti-fuse one-time programmable memory cell 30 according to another embodiment of the present disclosure. In FIG. 3D, a P well region 301 is disposed on a substrate 300. The selection transistor 31, the programmable transistor 32 and the programmable transistor 33 are disposed in the P well region 301. The selection transistor 31 comprises a gate structure 302, a first N-type doped region 304, a second N-type doped region 305 and N-type lightly doped drains 307-308. The programmable transistor 32 comprises a gate structure 303, the first N-type doped region 304 and N-type lightly doped drains 309-311. The programmable transistor 33 comprises a gate structure 314, the first N-type doped region 304, an isolation region 315 and an N-type lightly doped drain 312. Compared to the anti-fuse one-time programmable memory cell 20 of FIG. 2B, the anti-fuse one-time programmable memory cell 30 of FIG. 3D further comprises the gate structure 314, the isolation region 315 and the N-type lightly doped drain 312.

Compared to the anti-fuse one-time programmable memory cell 30 of FIG. 3B, the fourth N-type doped region 313 of FIG. 3B is replaced by the isolation region 315 of FIG. 3D. The isolation region 315 is used to isolate multiple regions comprising different well regions on the substrate 300. In the embodiment of the present disclosure, the purpose of disposing the isolation region 315 is so that it can reduce leakage current between the anti-fuse one-time programmable memory cell 30 of FIG. 3D and its adjacent memory cells.

In the embodiment of the present disclosure, the isolation region 315 is implemented by shallow trench isolation (STI). The isolation region 315 also can adopt techniques of local oxidation of silicon (LOCOS) or deep trench isolation (DTI) or other electrical isolation technologies to isolate active areas of transistors. In a specific embodiment of the present disclosure, steps of STI comprises a lithography using dry or wet etching to form a trench and to form one or more dielectric layers to fill the trench by chemical vapor deposition (CVD).

Figure 3E:
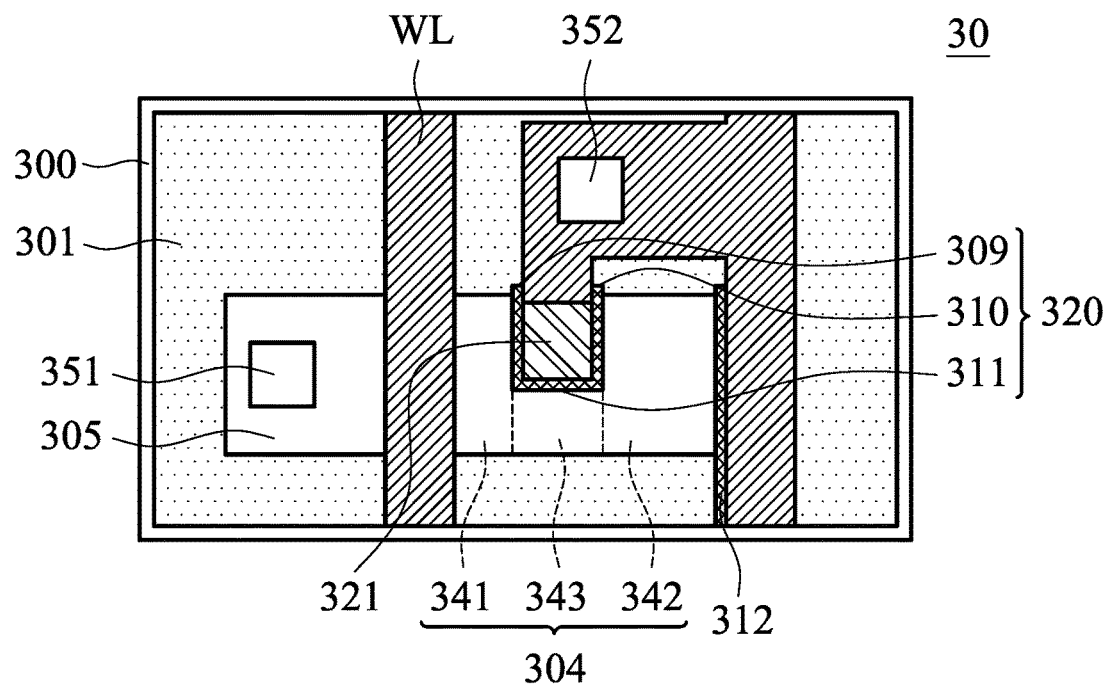
FIG. 3E shows a top view of an integrated circuit layout of the anti-fuse one-time programmable memory cell 30 of FIG. 3D according to another embodiment of the present disclosure.

FIG. 3E shows a top view of an integrated circuit layout of the anti-fuse one-time programmable memory cell 30 of FIG. 3D according to another embodiment of the present disclosure. The difference between FIG. 3C and FIG. 3E is that the fourth N-type doped region 313 of FIG. 3B is replaced by the isolation region 315 of FIG. 3D.

Figure 4A:
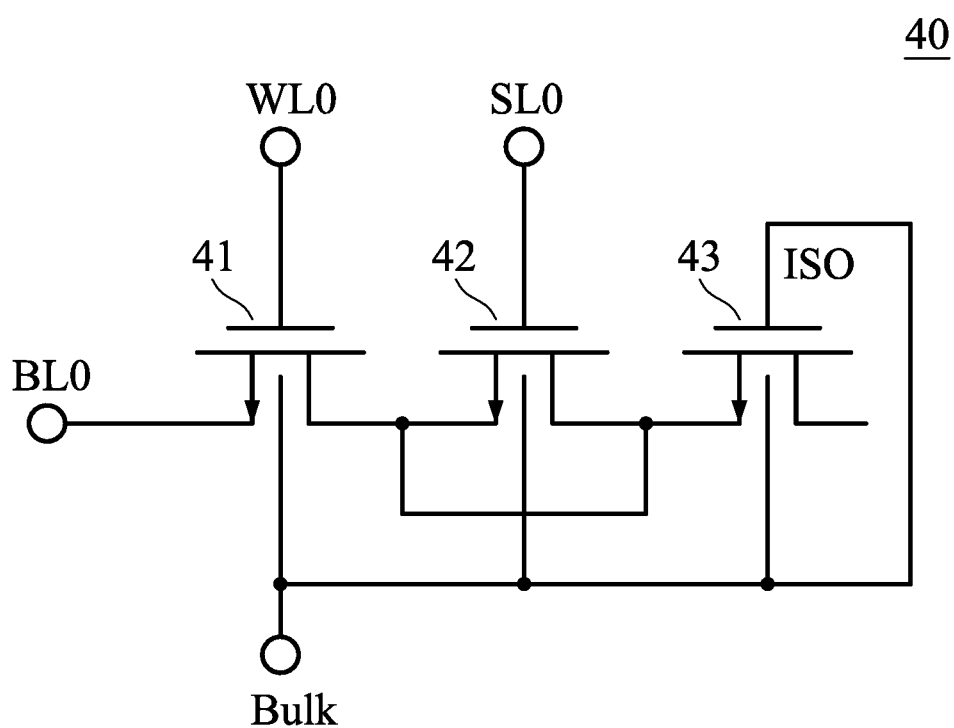
FIG. 4A shows a circuit diagram of an anti-fuse one-time programmable memory cell 40 according to an embodiment of the present disclosure.

FIG. 4A shows a circuit diagram of an anti-fuse one-time programmable memory cell 40 according to an embodiment of the present disclosure. In FIG. 4A, the anti-fuse one-time programmable memory cell 40 comprises a selection transistor 41, a programmable transistor 42 and an isolation transistor 43. A word line WL is electrically connected to a gate of the selection transistor 41. A terminal (source or drain) of the selection transistor 41 is electrically connected to a bit line BL, another terminal (drain or source) of the selection transistor 41 is electrically connected to the programmable transistor 42. A gate of the programmable transistor 42 is electrically connected to an anti-fuse gate line SL, and two terminals of the programmable transistor 42 and a source of the isolation transistor 43 are electrically connected together. A gate of the isolation transistor 43 (node ISO) is electrically connected to a base electrode (Bulk).

Compared to FIG. 2A, the anti-fuse one-time programmable memory cell 40 of FIG. 4A further comprises the isolation transistor 43. The purpose of adding the isolation transistor 43 is to use the isolation transistor 43 to improve leakage current of the anti-fuse one-time programmable memory cell 40. For example, reducing leakage current between the anti-fuse one-time programmable memory cell 40 and adjacent memory cells. In FIG. 4A, the gate of the isolation transistor 43 is electrically connected to ground or electrically connected to the substrate 400 so that the isolation transistor 43 is off.

Figure 4B:
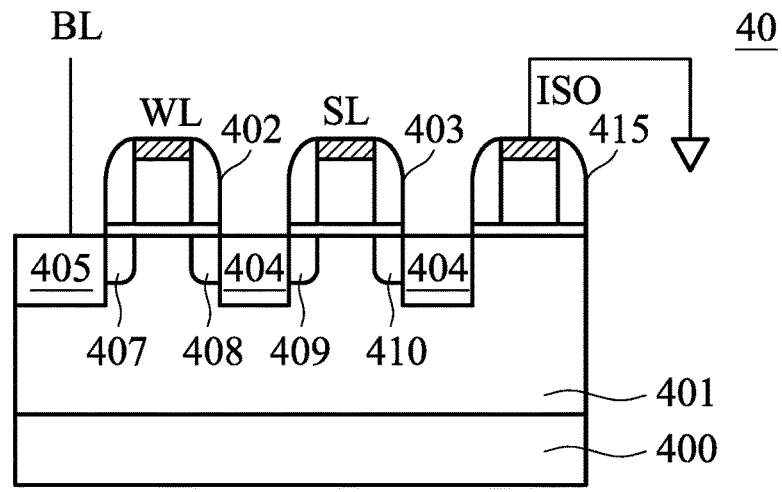
FIG. 4B shows a cross-sectional view of the anti-fuse one-time programmable memory cell 40 according to an embodiment of the present disclosure.

FIG. 4B shows a cross-sectional view of the anti-fuse one-time programmable memory cell 40 according to an embodiment of the present disclosure. In the embodiment of FIG. 4B of the present disclosure, a P well region 401 is disposed on a substrate 400. The selection transistor 41, the programmable transistor 42 and the isolation transistor 43 are disposed in the P well region 401. The selection transistor 41 comprises a gate structure 402, a first N-type doped region 404, a second N-type doped region 405 and N-type lightly doped drains 407-408. The programmable transistor 42 comprises a gate structure 403, the first N-type doped region 404 and N-type lightly doped drains 409-411. The isolation transistor 43 comprises a gate structure 415 and a second portion doped region 442 of the first N-type doped region 404.

Compared to the anti-fuse one-time programmable memory cell 20 of FIG. 2B, the anti-fuse one-time programmable memory cell 40 of FIG. 4B further comprises the gate structure 411 electrically connected to the substrate 400. In the embodiment of the present disclosure, the gate structure 415 is used to reduce leakage current between the anti-fuse one-time programmable memory cell 40 and adjacent memory cells.

Figure 4C:
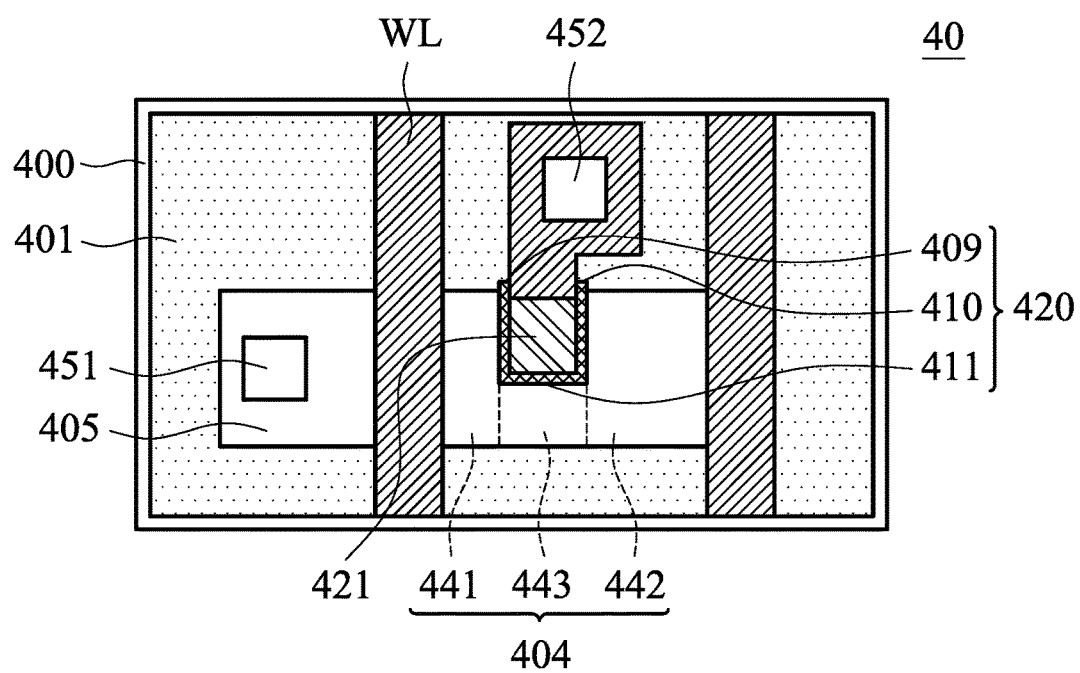
FIG. 4C shows a top view of an integrated circuit layout of the anti-fuse one-time programmable memory cell 40 of FIG. 4B according to an embodiment of the present disclosure.

FIG. 4C shows a top view of an integrated circuit layout of the anti-fuse one-time programmable memory cell 40 of FIG. 4B according to an embodiment of the present disclosure. Compared to FIG. 2C, the anti-fuse one-time programmable memory cell 40 of FIG. 4C further comprises the gate structure 415, wherein the gate structure 415 is disposed on one side of the second portion doped region 442 of the first N-type doped region 404.

Similar to FIG. 2C, the anti-fuse one-time programmable memory cell 40 of FIG. 4C also comprises a first lightly doped region 420, wherein the first lightly doped region 420 comprises N-type lightly doped drains 409, 410 and 411. Similarly, the first N-type doped region 404 also comprises a first portion doped region 441, a second portion doped region 442 and a third portion doped region 443. In FIG. 4C, the gate structure 403 of the programmable transistor 42 is disposed to vacate an area for disposing the third portion doped region 443 and the N-type lightly doped drain 411. Accordingly, the third portion doped region 443 is disposed between the first portion doped region 441 and the second portion doped region 442. The first lightly doped region 420 is respectively adjacent to the first portion doped region 441, the second portion doped region 442 and the third portion doped region 443, and the first lightly doped region 420 is disposed around a channel region 421 of the programmable transistor 42. A metal contact 451 having ohmic contact is formed on the second N-type doped region 405. The metal contact 451 is used to be electrically connected between the second N-type doped region 405 and the bit line BL. The word line WL is electrically connected to the gate structure 402 of the selection transistor 41. A metal contact 452 having ohmic contact is formed on the programmable transistor 42. The metal contact 452 is used to be electrically connected between a gate of the programmable transistor 42 and the anti-fuse gate line SL.

Figure 4D:
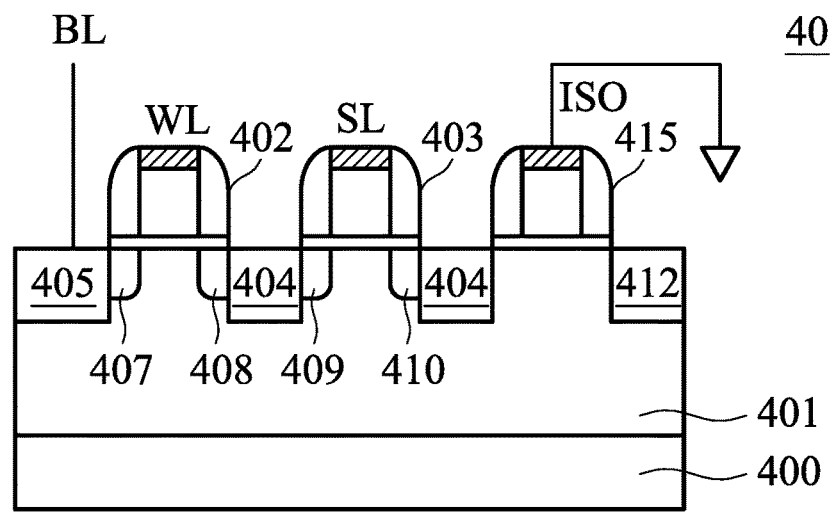
FIG. 4D shows a cross-sectional view of the anti-fuse one-time programmable memory cell 40 according to another embodiment of the present disclosure.

FIG. 4D shows a cross-sectional view of the anti-fuse one-time programmable memory cell 40 according to another embodiment of the present disclosure. In the embodiment of FIG. 4D of the present disclosure, the P well region 401 is disposed on the substrate 400. The selection transistor 41, the programmable transistor 42 and the isolation transistor 43 are disposed in the P well region 401. The selection transistor 41 comprises the gate structure 402, the first N-type doped region 404, the second N-type doped region 405 and N-type lightly doped drains 407-408. The programmable transistor 42 comprises the gate structure 403, the first N-type doped region 404 and N-type lightly doped drains 409-411. The isolation transistor 43 comprises the gate structure 415, a second portion doped region 442 of the first N-type doped region 404 and a third N-type doped region 412.

Compared to the anti-fuse one-time programmable memory cell 40 of FIG. 4B, the anti-fuse one-time programmable memory cell 40 of FIG. 4D further comprises the third N-type doped region 412. A gate structure 415 of the isolation transistor 43 is electrically connected to ground or electrically connected to the substrate 400 for reducing leakage current between the anti-fuse one-time programmable memory cell 40 and adjacent memory cells.

Figure 4E:
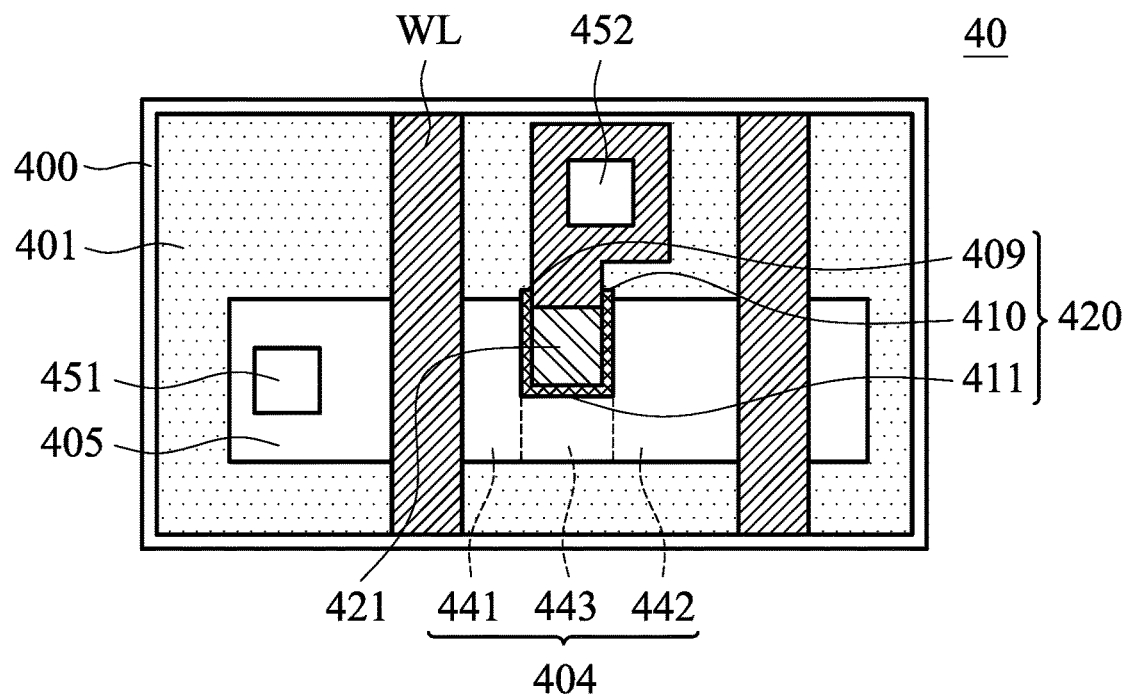
FIG. 4E shows a top view of an integrated circuit layout of the anti-fuse one-time programmable memory cell 40 of FIG. 4D according to another embodiment of the present disclosure.

FIG. 4E shows a top view of an integrated circuit layout of the anti-fuse one-time programmable memory cell 40 of FIG. 4D according to another embodiment of the present disclosure. Compared to FIG. 4C, the anti-fuse one-time programmable memory cell 40 of FIG. 4E further comprises the third N-type doped region 412 disposed in the P well region 401, wherein the second portion doped region 442 of the first N-type doped region 404 and the third N-type doped region 412 are disposed at two sides of the gate structure 415. Apart from this, the anti-fuse one-time programmable memory cell 40 of FIG. 4E is identical to the anti-fuse one-time programmable memory cell 40 of FIG. 4C.

Figure 4F:
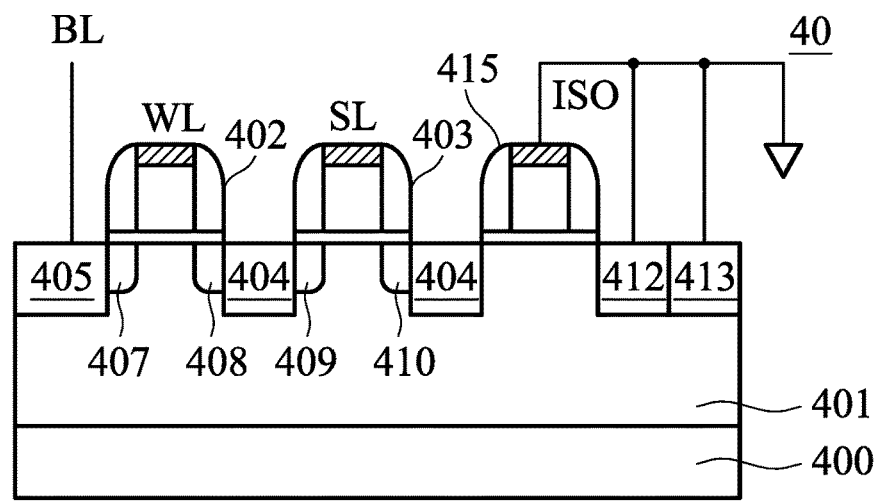
FIG. 4F shows a cross-sectional view of the anti-fuse one-time programmable memory cell 40 according to another embodiment of the present disclosure.

FIG. 4F shows a cross-sectional view of the anti-fuse one-time programmable memory cell 40 according to another embodiment of the present disclosure. Compared to the anti-fuse one-time programmable memory cell 40 of FIG. 4D, the anti-fuse one-time programmable memory cell 40 of FIG. 4F further comprises a P-type doped region 413 disposed at the right side of the third N-type doped region 412. In FIG. 4, the gate structure 415, the third N-type doped region 412 and the P-type doped region 413 are all electrically connected to ground or electrically connected to the substrate 400 for reducing leakage current between the anti-fuse one-time programmable memory cell 40 and adjacent memory cells. Compared to the isolation transistor 43 of FIG. 4D, the isolation transistor 43 of FIG. 4F can further reduce the leakage current.

Figure 4G:
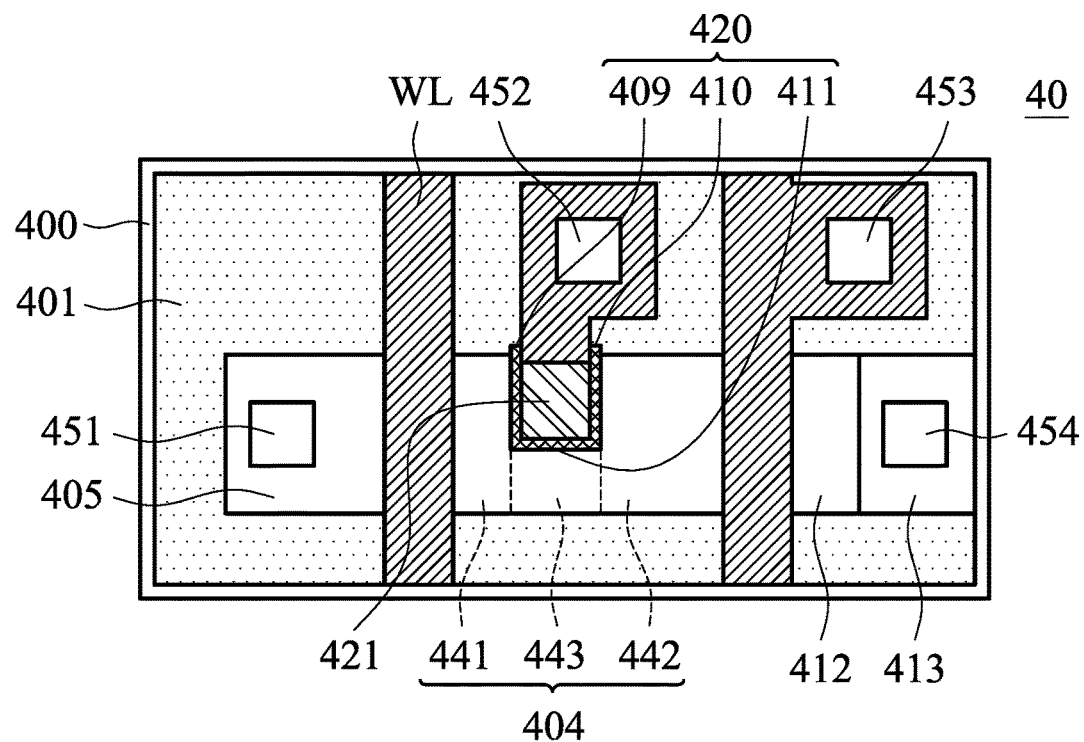
FIG. 4G shows a top view of an integrated circuit layout of the anti-fuse one-time programmable memory cell 40 of FIG. 4F according to another embodiment of the present disclosure.

FIG. 4G shows a top view of an integrated circuit layout of the anti-fuse one-time programmable memory cell 40 of FIG. 4F according to another embodiment of the present disclosure. In FIG. 4G, a metal contact 453 is formed on the gate structure 415 and is electrically connected to the base electrode (Bulk). A metal contact 454 is formed on P-type doped region 413 and is electrically connected to the base electrode (Bulk). The third N-type doped region 412 is also electrically connected to the base electrode (Bulk). Apart from this, the anti-fuse one-time programmable memory cell 40 of FIG. 4G is identical to the anti-fuse one-time programmable memory cell 40 of FIG. 4E.

Figure 4H:
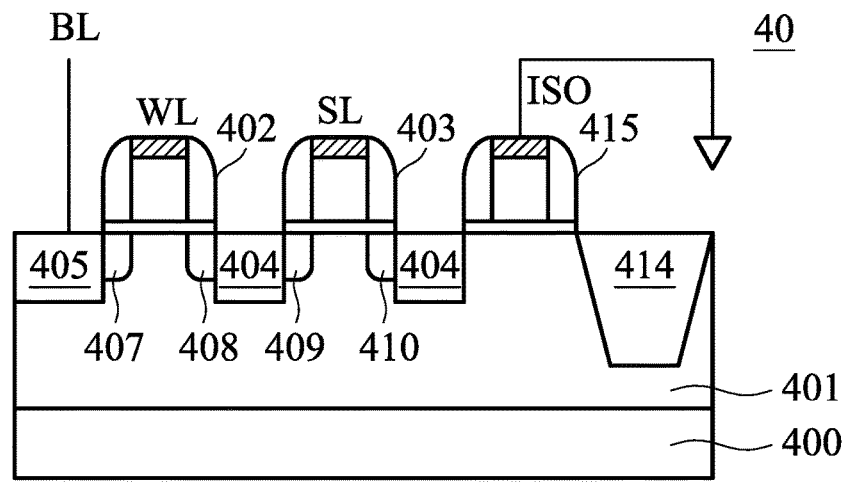
FIG. 4H shows a cross-sectional view of the anti-fuse one-time programmable memory cell 40 according to another embodiment of the present disclosure.
Figure 4I:
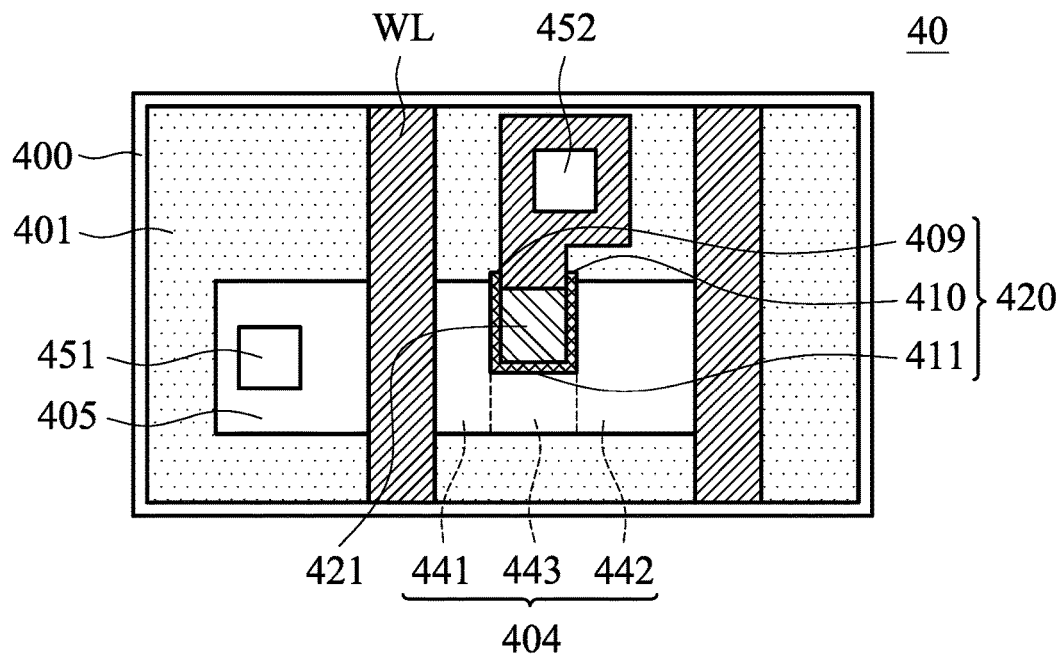
FIG. 4I shows a top view of an integrated circuit layout of the anti-fuse one-time programmable memory cell 40 of FIG. 4H according to another embodiment of the present disclosure.

FIG. 4H shows a cross-sectional view of the anti-fuse one-time programmable memory cell 40 according to another embodiment of the present disclosure, and FIG. 4I shows a top view of an integrated circuit layout of the anti-fuse one-time programmable memory cell 40 of FIG. 4H according to another embodiment of the present disclosure.

Compared to FIG. 4B, the anti-fuse one-time programmable memory cell 40 of FIG. 4H further comprises an isolation region 414. The isolation region 414 is used to isolate multiple regions comprising different well regions on the substrate 400. In the embodiment of the present disclosure, the isolation region 414 of the isolation transistor 43 also can reduce leakage current between the anti-fuse one-time programmable memory cell 40 and adjacent memory cells and is implemented by STI. The isolation region 414 also can adopt techniques of LOCOS or DTI or other electrical isolation technologies to isolate active areas of transistors. In a specific embodiment of the present disclosure, steps of STI comprises a lithography using dry or wet etching to form a trench and to form one or more dielectric layers to fill the trench by CVD.

Figure 5A:
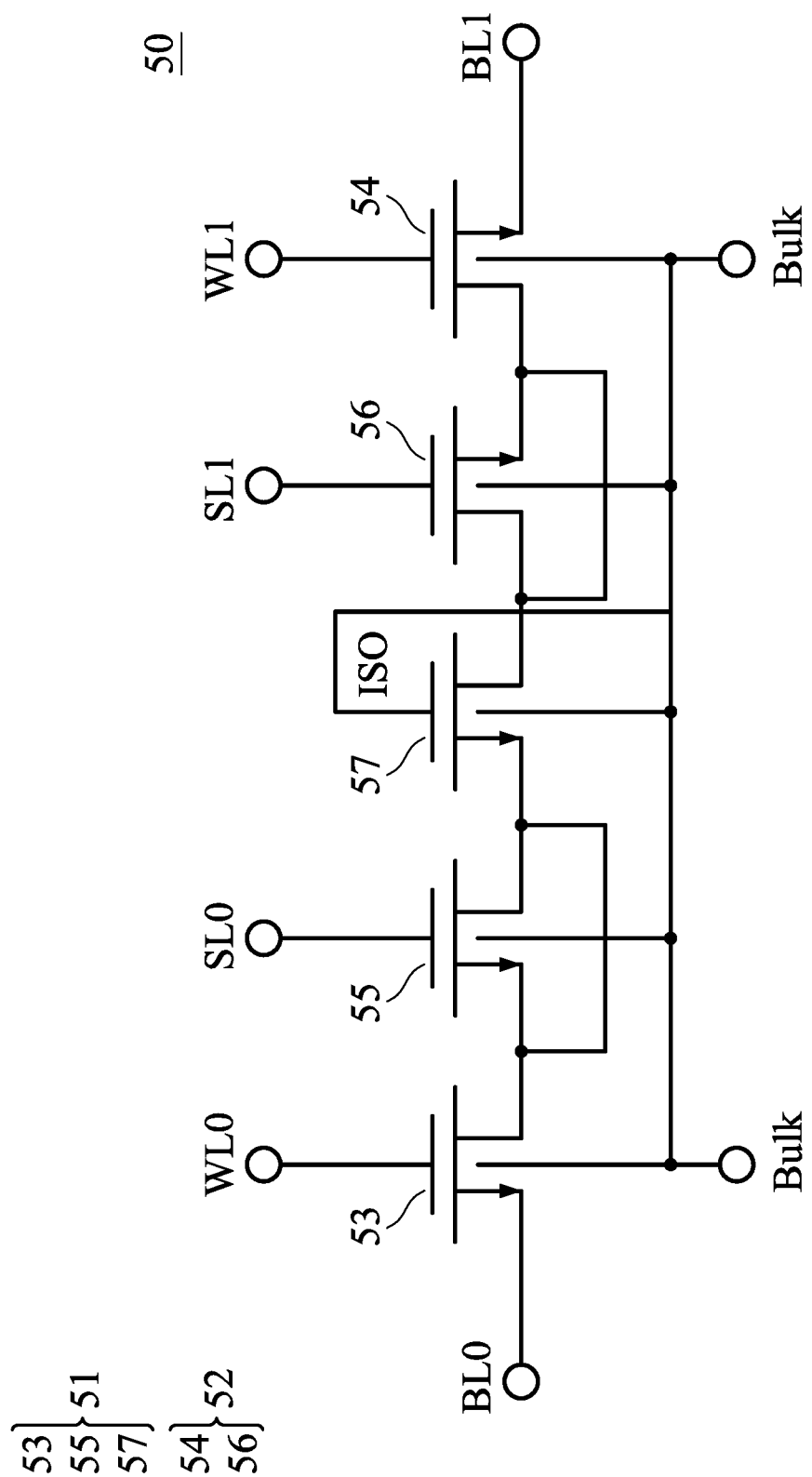
FIG. 5A shows a circuit diagram of an anti-fuse one-time programmable memory array 50 according to an embodiment of the present disclosure.

FIG. 5A shows a circuit diagram of an anti-fuse one-time programmable memory array 50 according to an embodiment of the present disclosure. In FIG. 5A, the anti-fuse one-time programmable memory array 50 comprises a first anti-fuse one-time programmable (OTP) memory cell 51 and a second anti-fuse OTP memory cell 52. The first anti-fuse OTP memory cell 51 comprises a selection transistor 53, a programmable transistor 54 and an isolation transistor 57, and the second anti-fuse OTP memory cell 52 comprises a selection transistor 54 and a programmable transistor 56. The first anti-fuse OTP memory cell 51 and the second anti-fuse OTP memory cell 52 are controlled by distinct word lines and distinct bit lines. In the embodiment of the present disclosure, the first anti-fuse OTP memory cell 51 is controlled by a bit line BL0, a word line WL0 and an anti-fuse gate line SL0, and the second anti-fuse OTP memory cell 52 is controlled by a bit line BL1, a word line WL1 and an anti-fuse gate line SL1.

In FIG. 5A, a gate of the isolation transistor 57 of the first anti-fuse OTP memory cell 51 (node ISO) is electrically connected to the base electrode (Bulk). The isolation transistor 57 is used to isolate the adjacent second anti-fuse OTP memory cell 52 so that leakage current generated by the first anti-fuse OTP memory cell 51 cannot affect the adjacent second anti-fuse OTP memory cell 52. Similarity, the isolation transistor 57 also can avoid leakage current generated from the second anti-fuse OTP memory cell 52 affecting the adjacent first anti-fuse OTP memory cell 51. In addition, since the isolation transistor 57 can reduce leakage current between adjacent anti-fuse OTP memory cells, more anti-fuse OTP memory cells can be disposed in a memory device. Accordingly, compared to the anti-fuse one-time programmable memory cells 20, 30 and 40, the memory device applied in the anti-fuse one-time programmable memory array 50 with the same memory capacity can be designed at a smaller size.

Figure 5B:
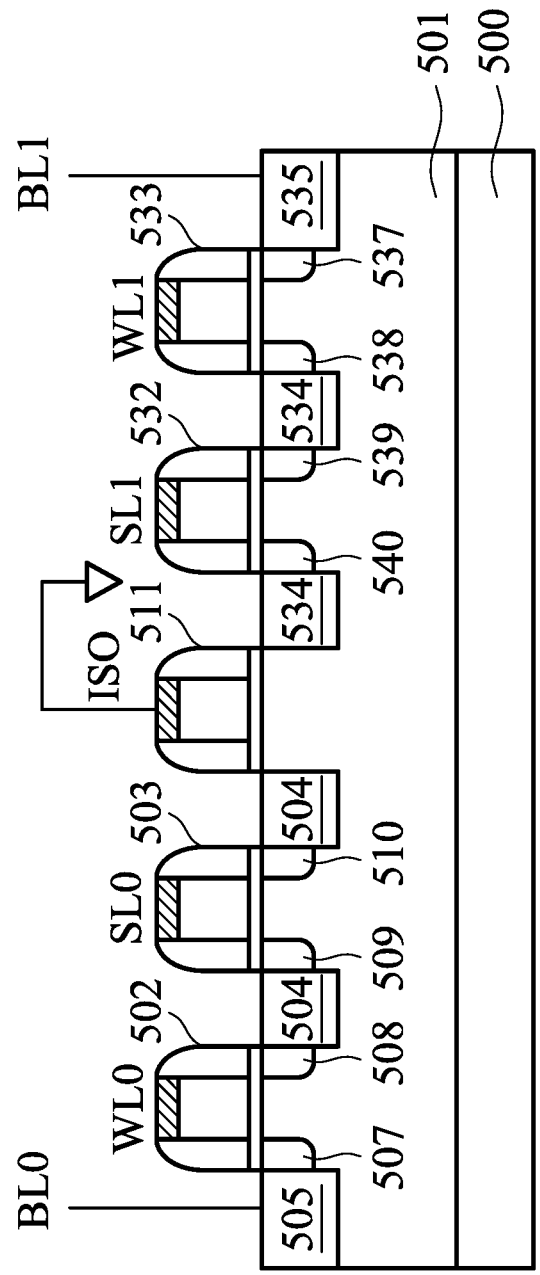
FIG. 5B shows a cross-sectional view of an anti-fuse one-time programmable memory array 50 according to an embodiment of the present disclosure.

FIG. 5B shows a cross-sectional view of an anti-fuse one-time programmable memory array 50 according to an embodiment of the present disclosure. In FIG. 5B, an integrated circuit layout of the first anti-fuse OTP memory cell 51 is implemented by the integrated circuit layout of the anti-fuse one-time programmable memory cell 40 shown in FIG. 4B, and an integrated circuit layout of the second anti-fuse OTP memory cell 52 is implemented by the integrated circuit layout of the anti-fuse one-time programmable memory cell 20 shown in FIG. 2B.

In FIG. 5B, the first anti-fuse OTP memory cell 51 and the second anti-fuse OTP memory cell 52 are both disposed in a P well region 501, wherein the P well region 501 is disposed on a substrate 500. The first anti-fuse OTP memory cell 51 comprises gate structures 502, 503 and 511, a first N-type doped region 504, a second N-type doped region 505 and N-type lightly doped drains 507-511. The second anti-fuse OTP memory cell 52 comprises gate structures 532 and 533, a first N-type doped region 534, a second N-type doped region 535 and N-type lightly doped drains 537-541.

Figure 5C:
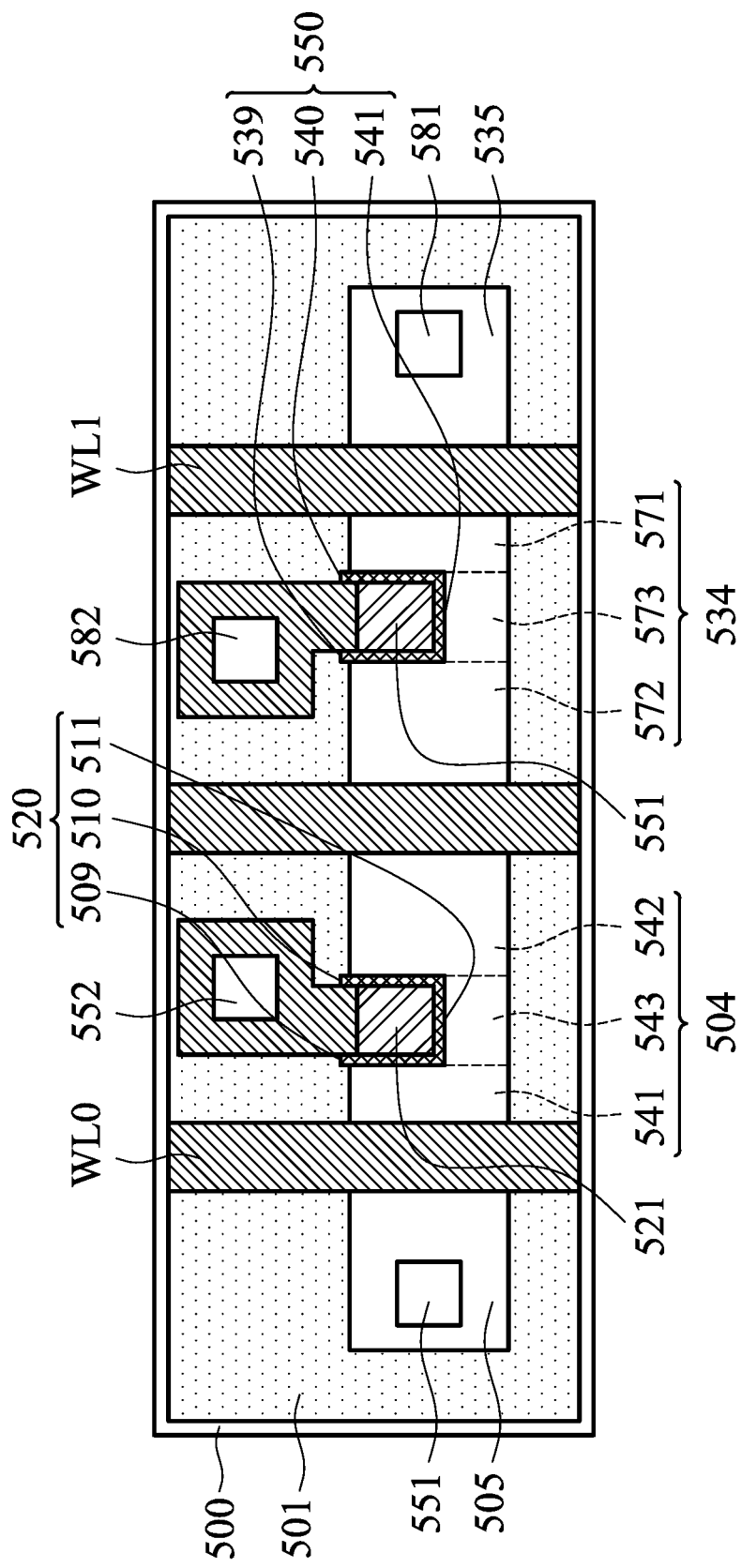
FIG. 5C shows a top view of an integrated circuit layout of the anti-fuse one-time programmable memory array 50 of FIG. 5B according to an embodiment of the present disclosure.

FIG. 5C shows a top view of an integrated circuit layout of the anti-fuse one-time programmable memory array 50 of FIG. 5B according to an embodiment of the present disclosure. In FIG. 5C, the anti-fuse one-time programmable memory array 50 is constituted by the anti-fuse one-time programmable memory cell 20 shown in FIG. 2C and the anti-fuse one-time programmable memory cell 40 shown in FIG. 4C.

Similar to the anti-fuse one-time programmable memory cell 40 shown in FIG. 4C, the first anti-fuse OTP memory cell 51 of FIG. 5C also comprises a first lightly doped region 520, wherein the first lightly doped region 520 comprises N-type lightly doped drains 509, 510 and 511. Similarly, the first N-type doped region 504 of FIG. 5C also comprises a first portion doped region 541, a second portion doped region 542 and a third portion doped region 543. The third portion doped region 543 is disposed between the first portion doped region 541 and the second portion doped region 542. The first lightly doped region 520 is respectively adjacent to the first portion doped region 541, the second portion doped region 542 and the third portion doped region 543, and the first lightly doped region 520 is disposed around a channel region 521 of the programmable transistor 55. A metal contact 551 having ohmic contact is formed on the second N-type doped region 505. The metal contact 551 is used to be electrically connected between the second N-type doped region 505 and the bit line BL. The word line WL is electrically connected to the gate structure 502 of the selection transistor 53. A metal contact 552 having ohmic contact is formed on the programmable transistor 55. The metal contact 552 is used to be electrically connected between a gate of the programmable transistor 55 and the anti-fuse gate line SL.

Similar to the anti-fuse one-time programmable memory cell 20 shown in FIG. 2C, the second anti-fuse OTP memory cell 52 of FIG. 5C also comprises a first lightly doped region 550, wherein the first lightly doped region 520 comprises N-type lightly doped drains 539, 540 and 541. Similarly, the first N-type doped region 534 of FIG. 5C also comprises a first portion doped region 571, a second portion doped region 572 and a third portion doped region 573. The third portion doped region 573 is disposed between the first portion doped region 571 and the second portion doped region 572. The first lightly doped region 550 is adjacent to the first portion doped region 571, the second portion doped region 572 and the third portion doped region 573, and the first lightly doped region 550 is disposed around a channel region 551 of the programmable transistor 56. A metal contact 581 having ohmic contact is formed on the second N-type doped region 535. The metal contact 581 is used to be electrically connected between the second N-type doped region 535 and the bit line BL. The word line WL is electrically connected to the gate structure 533 of the selection transistor 54. A metal contact 582 having ohmic contact is formed on the programmable transistor 56. The metal contact 582 is used to be electrically connected between a gate of the programmable transistor 56 and the anti-fuse gate line SL.

In the above embodiments of the present invention, the selection transistors 21, 31, 41, 53 and 54 comprise but are not limited to I/O MOS, core MOS or D MOS.

In the above embodiments of the present invention, the substrates 200, 300, 400 and 500 are silicon substrates, but it is not limited thereto. The substrates 200, 300, 400 and 500 also comprise semiconductor elements such as crystalline silicon or germanium, or compound semiconductors such as silicon carbide, gallium nitride, gallium arsenide, indium phosphide, indium arsenide and/or gallium antimonide, or alloy compounds such as SiGe, GaAs, AlAs, AlGaAs, GaInAs, GaInP, and/or GaInAs or combinations of the above materials. The substrates 200, 300, 400 and 500 can also be an insulating layer on silicon (SOI), a doped epitaxial layer, or semiconductor structures of a multilayer compound.

In the above embodiments of the present invention, the gate structures include at least one of a gate dielectric layer, a sidewall spacer or a gate electrode layer. In some embodiments, the gate dielectric layer includes at least one of silicon oxide, silicon nitride, silicon oxynitride, or a high-k dielectric material. In some embodiments, the sidewall spacer includes at least one of silicon nitride, silicon oxide, silicon carbide or silicon oxynitride. In some embodiments, the gate electrode layer includes at least one of polysilicon, Al, Cu, W, Ti, Ta, TiN, TiAl, TiAlN, TaN, NiSi or CoSi. In some embodiments, the gate structures are formed using at least one of an atomic layer deposition (ALD), chemical vapor deposition (CVD), physical vapor deposition (PVD) or thermal oxidation process.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using another structure, functionality, or structure and functionality in addition to or other than one or more of the aspects set forth herein.

It should be understood that any specific order or hierarchy of steps in any disclosed process is an example of a sample approach. Based upon design preferences, it should be understood that the specific order or hierarchy of steps in the processes may be rearranged while remaining within the scope of the present disclosure. The accompanying method claims present elements of the various steps in a sample order, and are not meant to be limited to the specific order or hierarchy presented.

While the present disclosure has been described by way of example and in terms of preferred embodiment, it should be understood that the present disclosure is not limited thereto. On the contrary, it is intended to cover various modifications and similar arrangements (as would be apparent to a person skilled in the art). Therefore, the scope of the appended claims should be accorded the broadest interpretation so as to encompass all such modifications and similar arrangements.

What is claimed is:

1. An anti-fuse one-time programmable memory cell, comprising:
    a substrate;
    a well region, disposed on the substrate;
    a first programmable transistor, comprising:
        a gate structure, disposed on the well region;
        a first doped region, divided into a first portion doped region, a second portion doped region and a third portion doped region, wherein the first, second and third portion doped regions are respectively disposed at three sides of the gate structure of the first programmable transistor and disposed in the well region; and
        wherein the first and second portion doped regions are respectively a source and a drain of the first programmable transistor, and the third portion doped region is disposed between the first and second portion doped regions; and
        a first lightly doped region, disposed in the well region, wherein the first lightly doped region is distributed around a channel region of the first programmable transistor and is respectively adjacent to the first, second and third portion doped regions; and
    a selection transistor, connected in series to the first programmable transistor through the first portion doped region and comprising a gate structure and a second doped region, wherein the gate structure of the selection transistor is electrically connected to a word line; and
    wherein the first and second portion doped regions are respectively disposed on both sides of the gate structure of the selection transistor and the second doped region is electrically connected to a bit line.

2. The anti-fuse one-time programmable memory cell of claim 1, further comprising an insulated transistor, wherein the second portion doped region is shared by the insulated transistor and the first programmable transistor; and
    wherein the insulated transistor comprises a gate structure disposed on the well region and the gate structure of the insulated transistor is electrically connected to the substrate.

3. The anti-fuse one-time programmable memory cell of claim 2, wherein the insulated transistor further comprises a third doped region disposed in the well region; and
    wherein the second portion doped region and the third doped region are respectively disposed at both sides of the gate structure of the insulated transistor.

4. The anti-fuse one-time programmable memory cell of claim 3, wherein the insulated transistor further comprises a fourth doped region disposed in the well region and adjacent to the third doped region; and
    wherein the third doped region and the fourth doped region are both electrically connected to the substrate.

5. The anti-fuse one-time programmable memory cell of claim 2, wherein the insulated transistor further comprises an isolation area disposed in the well region; and
    wherein the second portion doped region and the isolation area are respectively disposed at two sides of the gate structure of the insulated transistor.

6. The anti-fuse one-time programmable memory cell of claim 1, further comprising a second programmable transistor which shares the second portion doped region with the first programmable transistor, wherein the second programmable transistor comprising:
    a gate structure, disposed on the well region and electrically connected to the gate structure of the first programmable transistor; and
    a second lightly doped region, disposed between the second portion doped region and a second selection gate.

7. The anti-fuse one-time programmable memory cell of claim 6, wherein the second programmable transistor further comprises a fifth doped region disposed in the well region; and
    wherein the second portion doped region and the fifth doped region are respectively disposed at two sides of the gate structure of the second programmable transistor.

8. The anti-fuse one-time programmable memory cell of claim 6, wherein the second programmable transistor further comprises an isolation region disposed in the well region; and
    wherein the second portion doped region and the isolation region are respectively disposed at both sides of the gate structure of the second programmable transistor.

9. The anti-fuse one-time programmable memory cell of claim 1, wherein the anti-fuse one-time programmable memory cell operates in a programmable operation, voltage of the bit line is 0, a voltage which is higher than a threshold voltage of the selection transistor is provided to the word line and a programming voltage is provided to the gate structure of the programmable transistor.

10. The anti-fuse one-time programmable memory cell of claim 1, wherein the anti-fuse one-time programmable memory cell operates in a read operation, a voltage which is higher than a threshold voltage of the selection transistor is provided to the word line, a read voltage is provided to the gate structure of the programmable transistor and the bit line is electrically connected to an external sense amplifier; and
    wherein the sense amplifier reads a conduct current from the bit line to determine digital information of the anti-fuse one-time programmable memory cell.

11. The anti-fuse one-time programmable memory cell of claim 1, wherein the first lightly doped region is N-type Lightly Doped Drain.

12. The anti-fuse one-time programmable memory cell of claim 1, wherein the selection transistor is N-type Metal-Oxide-Semiconductor Field-Effect Transistor, the well region is a P-type well region and the first and second doped regions are both N-type doped regions.

13. An anti-fuse one-time programmable memory array, comprising:

a first memory cell, wherein structure of first memory cell is the same as the anti-fuse one-time programmable memory cell of claim 1;

a first word line, electrically connected to the gate structure of the selection transistor of the first memory cell;

a first bit line, electrically connected to the second doped region of the selection transistor of the first memory cell;

a first anti-fuse gate line, electrically connected to the gate structure of the first programmable transistor of the first memory cell;

a second memory cell, wherein the second memory cell is an anti-fuse one-time programmable memory cell, comprising:

a substrate;

a well region, disposed on the substrate;

a first programmable transistor, comprising:

a gate structure, disposed on the well region;

a first doped region, divided into a first portion doped region, a second portion doped region and a third portion doped region, wherein the first, second and third portion doped regions are respectively disposed at three sides of the gate structure of the first programmable transistor and disposed in the well region; and wherein the first and second portion doped regions are respectively a source and a drain of the first programmable transistor, and the third portion doped region is disposed between the first and second portion doped regions; and a first lightly doped region, disposed in the well region, wherein the first lightly doped region is distributed around a channel region of the first programmable transistor and is respectively adjacent to the first, second and third portion doped regions; and a selection transistor, connected in series to the first programmable transistor through the first portion doped region and comprising a gate structure and a second doped region, wherein the gate structure of the selection transistor is electrically connected to a word line; and wherein the first and second portion doped regions are respectively disposed on both sides of the gate structure of the selection transistor and the second doped region is electrically connected to a bit line, further comprising an insulated transistor, wherein the second portion doped region is shared by the insulated transistor and the first programmable transistor; and wherein the insulated transistor comprises a gate structure disposed on the well region and the gate structure of the insulated transistor is electrically connected to the substrate, wherein the insulated transistor further comprises a third doped region disposed in the well region; and wherein the second portion doped region and the third doped region are respectively disposed at both sides of the gate structure of the insulated transistor; and wherein the second portion doped region of the first memory cell is used as the third doped region of the second memory cell and the first and second memory cells share the same substrate and the same well region;

a second word line, electrically connected to the gate structure of the selection transistor of the second memory cell;

a second bit line, electrically connected to the second doped region of the selection transistor of the second memory cell; and a second anti-fuse gate line, electrically connected to the gate structure of the first programmable transistor of the second memory cell.

14. The anti-fuse one-time programmable memory array of claim 13, wherein the selection transistor of the first memory cell and the selection transistor of the second memory cell are both N-type Metal-Oxide-Semiconductor Field-Effect Transistors, the well region is a P-type well region, and the first and second doped regions of the first memory cell and the first and second doped regions of the second memory cell are all N-type doped regions.

15. The anti-fuse one-time programmable memory array of claim 13, wherein the first lightly doped region of the first memory cell and the first lightly doped region of the second memory cell are N-type Lightly Doped Drains.

16. An anti-fuse one-time programmable memory array, comprising:

a first memory cell, wherein structure of first memory cell is the same as the anti-fuse one-time programmable memory cell of claim 1;

a first word line, electrically connected to the gate structure of the selection transistor of the first memory cell;

a first bit line, electrically connected to the second doped region of the selection transistor of the first memory cell;

a first anti-fuse gate line, electrically connected to the gate structure of the first programmable transistor of the first memory cell;

a second memory cell, wherein structure of second memory cell is the same as the anti-fuse one-time programmable memory cell of claim 1; and wherein the first and second memory cells share the same substrate and the same well region;

a second word line, electrically connected to the gate structure of the selection transistor of the second memory cell;

a second bit line, electrically connected to the second doped region of the selection transistor of the second memory cell;

a second anti-fuse gate line, electrically connected to the gate structure of the first programmable transistor of the second memory cell; and an isolation gate structure, disposed between the second portion doped region of the first memory cell and the second portion doped region of the second memory cell.

* * * * *